(12) United States Patent
Karikalan et al.

(10) Patent No.: US 8,928,128 B2
(45) Date of Patent: Jan. 6, 2015

(54) SEMICONDUCTOR PACKAGE WITH INTEGRATED ELECTROMAGNETIC SHIELDING

(75) Inventors: Sampath K. V. Karikalan, Irvine, CA (US); Kevin Kunzhong Hu, Irvine, CA (US); Sam Ziqun Zhao, Irvine, CA (US); Rezaur Rahman Khan, Rancho Santa Margarita, CA (US); Pieter Vorenkamp, Laguna Niguel, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/405,721

(22) Filed: Feb. 27, 2012

(65) Prior Publication Data

US 2013/0221499 A1    Aug. 29, 2013

(51) Int. Cl.
*H01L 23/538* (2006.01)

(52) U.S. Cl.
USPC .................. 257/659; 257/508; 257/E23.174

(58) Field of Classification Search
USPC ................................. 257/659, 508, E23.174
See application file for complete search history.

(56) References Cited

U.S. PATENT DOCUMENTS

| | | | |
|---|---|---|---|
| 6,002,168 A | 12/1999 | Bellaar |
| 6,709,898 B1 | 3/2004 | Ma |
| 6,743,661 B1 | 6/2004 | Drewery |
| 6,791,195 B2 | 9/2004 | Urushima |
| 7,220,667 B2 | 5/2007 | Yamagata |
| 7,585,702 B1 | 9/2009 | Wang |
| 7,834,450 B2 | 11/2010 | Kang |
| 7,901,986 B2 | 3/2011 | Arai |
| 8,008,125 B2 | 8/2011 | McConnelee |
| 8,022,555 B2 | 9/2011 | Hwang |
| 8,133,761 B2 | 3/2012 | Gerber |
| 8,202,763 B2 | 6/2012 | Meyer |
| 8,344,516 B2 | 1/2013 | Chainer |
| 8,461,672 B2 | 6/2013 | Haba |
| 2002/0030261 A1 | 3/2002 | Rolda |
| 2003/0036219 A1 | 2/2003 | Masumoto |
| 2006/0145328 A1 | 7/2006 | Hsu |
| 2006/0186531 A1 | 8/2006 | Hsu |
| 2006/0186536 A1 | 8/2006 | Hsu |
| 2006/0220262 A1 | 10/2006 | Meyer |
| 2006/0258044 A1 | 11/2006 | Meyer |
| 2007/0132082 A1 | 6/2007 | Tang |
| 2007/0209831 A1 | 9/2007 | Sakamoto |
| 2007/0273049 A1 | 11/2007 | Khan |
| 2007/0290376 A1 | 12/2007 | Zhao |
| 2008/0044944 A1 | 2/2008 | Wakisaka |

(Continued)

FOREIGN PATENT DOCUMENTS

TW           200516708           5/2005

*Primary Examiner* — Howard Weiss
*Assistant Examiner* — Tifney Skyles
(74) *Attorney, Agent, or Firm* — McDermott Will & Emery LLP

(57) ABSTRACT

There are disclosed herein various implementations of a shield interposer situated between a top active die and a bottom active die for shielding the active dies from electromagnetic noise. One implementation includes an interposer dielectric layer, a through-silicon via (TSV) within the interposer dielectric layer, and an electromagnetic shield. The TSV connects the electromagnetic shield to a first fixed potential. The electromagnetic shield may include a grid of conductive layers laterally extending across the shield interposer. The shield interposer may also include another electromagnetic shield connected to another fixed potential.

20 Claims, 5 Drawing Sheets

(56) References Cited

U.S. PATENT DOCUMENTS

| | | |
|---|---|---|
| 2008/0128882 A1 | 6/2008 | Baek |
| 2008/0157322 A1 | 7/2008 | Tang |
| 2008/0268638 A1 | 10/2008 | Dertinger |
| 2009/0053858 A1 | 2/2009 | Ko |
| 2009/0102030 A1 | 4/2009 | Khan |
| 2010/0019360 A1 | 1/2010 | Khan |
| 2010/0084754 A1 | 4/2010 | Yoo |
| 2010/0133534 A1 | 6/2010 | Do |
| 2010/0301474 A1 | 12/2010 | Yang |
| 2011/0024888 A1 | 2/2011 | Pagaila |
| 2011/0024906 A1 | 2/2011 | Meyer |
| 2011/0241185 A1 * | 10/2011 | Koester et al. ............ 257/659 |
| 2011/0254160 A1 | 10/2011 | Tsai |
| 2011/0272819 A1 | 11/2011 | Park |
| 2011/0278732 A1 | 11/2011 | Yu |
| 2011/0285030 A1 | 11/2011 | Meyer |
| 2012/0009738 A1 | 1/2012 | Crawford |
| 2012/0018899 A1 | 1/2012 | Pagaila |
| 2012/0062439 A1 * | 3/2012 | Liao et al. .................. 343/841 |
| 2012/0139105 A1 | 6/2012 | Lin |
| 2012/0152605 A1 | 6/2012 | Das |
| 2012/0168942 A1 | 7/2012 | Gan |
| 2012/0223429 A1 | 9/2012 | Khan |
| 2012/0225522 A1 | 9/2012 | Zhao |
| 2012/0241921 A1 * | 9/2012 | Lee et al. ................... 257/659 |
| 2012/0313240 A1 | 12/2012 | Cheng |
| 2012/0319293 A1 | 12/2012 | Cheah |
| 2013/0000968 A1 | 1/2013 | Zhao |
| 2013/0075917 A1 | 3/2013 | Law |
| 2013/0113098 A1 | 5/2013 | Hwang |
| 2013/0147023 A1 * | 6/2013 | Lin et al. .................... 257/659 |

\* cited by examiner

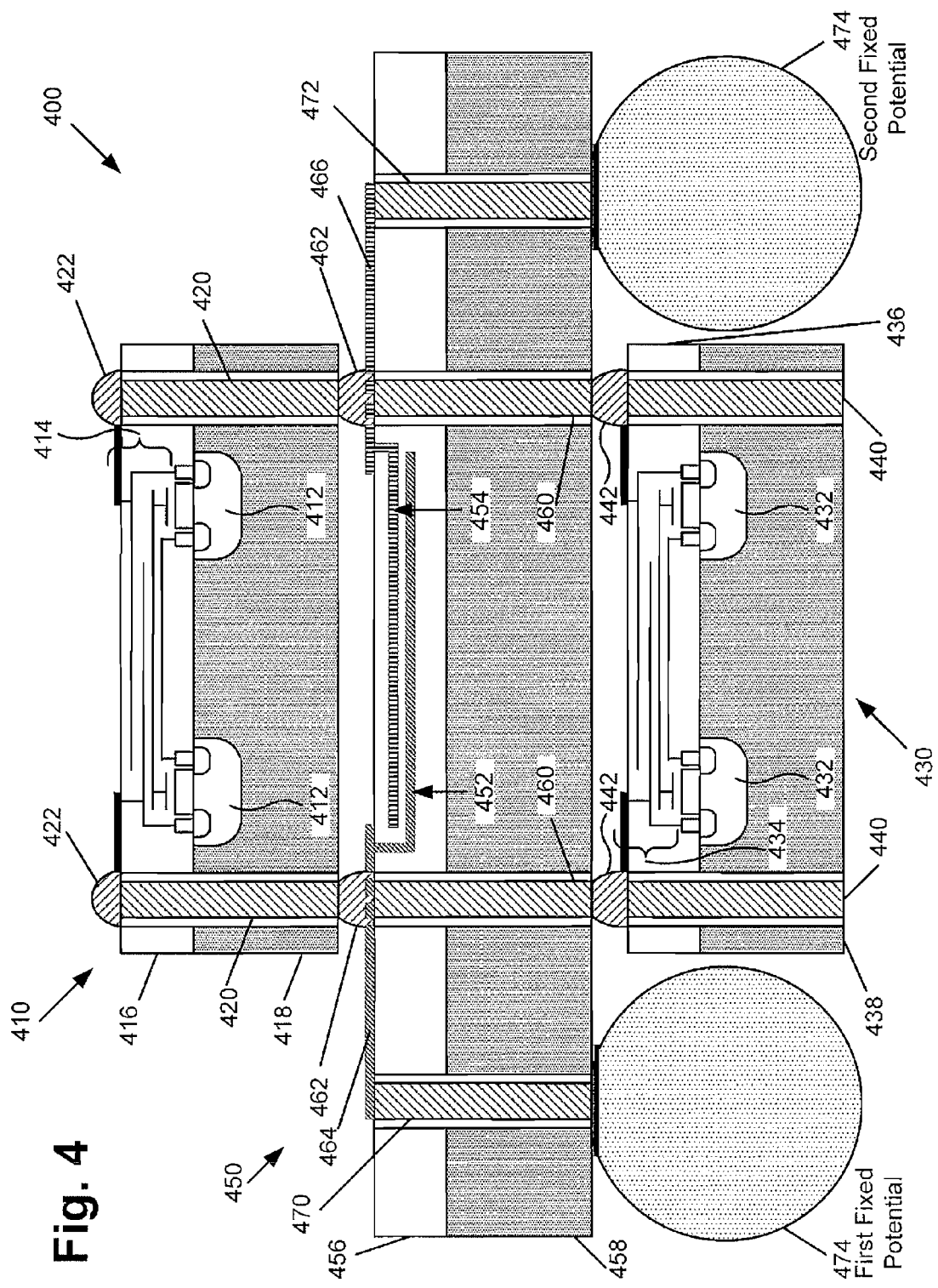

US 8,928,128 B2

SEMICONDUCTOR PACKAGE WITH INTEGRATED ELECTROMAGNETIC SHIELDING

BACKGROUND

There is an ever increasing need for reducing the size of semiconductor packages while increasing functionality. This need typically results in semiconductor package designs to accommodate more than one semiconductor die, where each die can be a complex die containing numerous transistors and multi-level interconnects. During operation, the complex dies generate large amounts of transient currents running through various interconnects on the dies. The large transient currents and the accompanying transient voltages in turn result in a great amount of electromagnetic noise generated by each die. Since advanced packages include multiple dies in close proximity, electromagnetic noise from one die has a great undesired impact in other dies in the package. More specifically, electromagnetic noise generated by one die typically induces undesired noise currents and noise voltages in the other dies in the package. The problem of inducing undesired noise is aggravated due to the reduction in size of semiconductor packages, and the reduction of separation between adjacent dies, and when more than two dies are housed in the same package.

Further, each semiconductor package may be exposed to external electromagnetic noise from other components in a system, such as other noisy semiconductor packages. Reduction of impact of electromagnetic noise is an important goal of advanced packaging design.

SUMMARY

The present disclosure is directed to a semiconductor package with integrated electromagnetic shielding, substantially as shown in and/or described in connection with at least one of the figures, as set forth more completely in the claims.

BRIEF DESCRIPTION OF THE DRAWINGS

FIG. 4 shows a cross-sectional view of one implementation of a semiconductor package including a shield interposer having solder humps.

DETAILED DESCRIPTION

Figure 1:
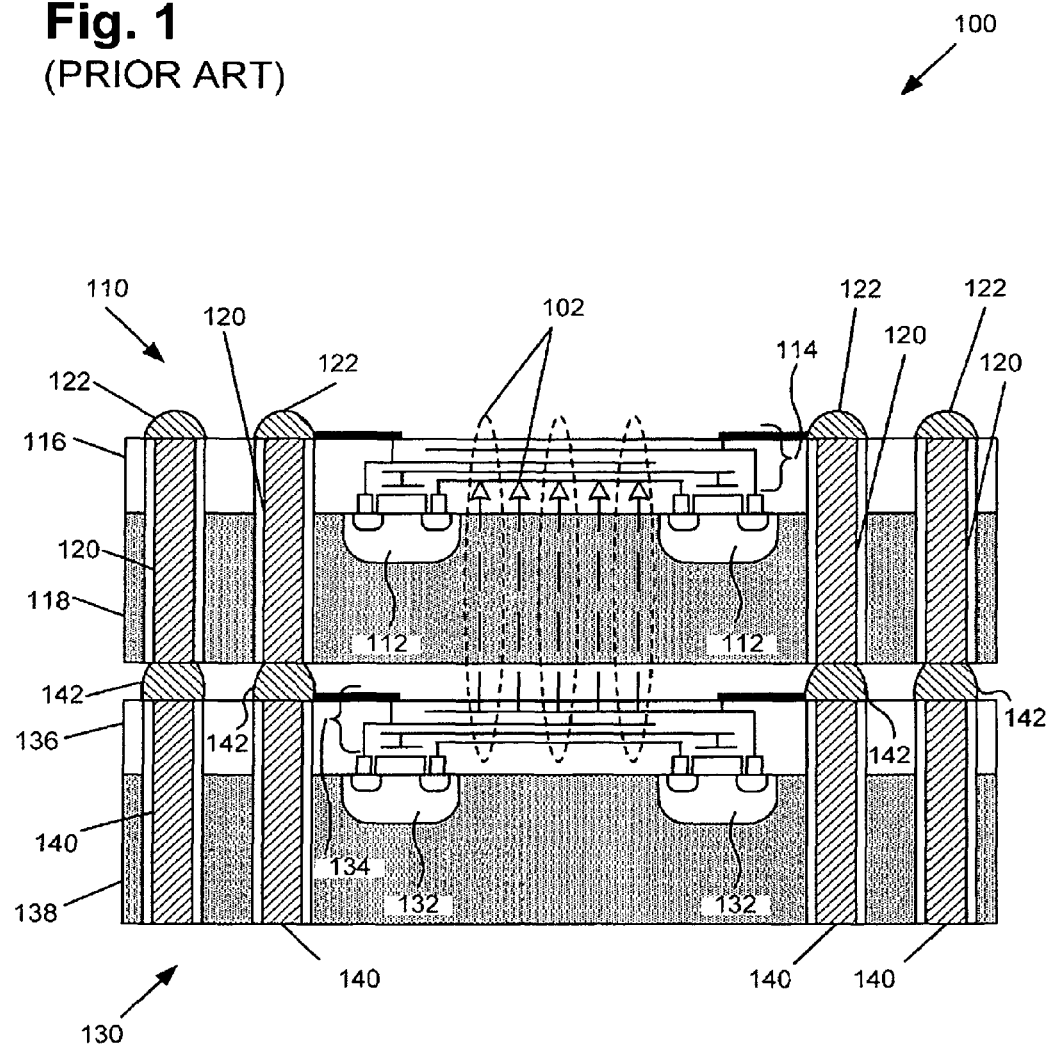
FIG. 1 shows a cross-sectional view of one implementation of a semiconductor package having a top active die stacked on a bottom active die.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view of one example of a semiconductor package fabricated using known techniques. As depicted in FIG. 1, semiconductor package 100 includes top active die 110 and bottom active die 130. Top active die 110 includes dielectric layer 116 situated on substrate 118. Top active die 110 includes transistors 112, which are examples of numerous transistors that are interconnected through interconnects 114. As seen in FIG. 1, interconnects 114 may be partially disposed within dielectric layer 116. Interconnects 114 may further couple transistors 112 to through-silicon vias (TSV) 120. TSVs 120 may extend completely through dielectric layer 116 and substrate 118, as shown in FIG. 1. Although FIG. 1 depicts top active die 110 having four TSVs 120, in other implementations, top active die 110 may include a different number of TSVs 120. In addition, top active die 110 may also include microbumps 122, which are connected to TSVs 120 in this implementation.

Bottom active die 130 includes dielectric layer 136 situated on substrate 138. Bottom active die 130 includes transistors 132, which are interconnected through interconnects 134. As seen in FIG. 1, interconnects 134 may be partially disposed within dielectric layer 136. Interconnects 134 may further couple transistors 132 to TSVs 140. TSVs 140 may extend completely through dielectric layer 136 and substrate 138, as shown in FIG. 1. Although FIG. 1 depicts bottom active die 130 having four TSVs 140, in other implementations, bottom active die 130 may include a different number of TSVs 140. In addition, bottom active die 130 also includes microbumps 142, which may be connected to TSVs 140. Further, microbumps 142 attach top active die 110 to bottom active die 130. Microbumps 142 may electrically and mechanically connect TSVs 120 to TSVs 140.

In FIG. 1, top active die 110 and bottom active die 130 are similar in size and complexity. However, in other implementations, top active die 110 and bottom active die 130 may not be similar. Furthermore, in other implementations, semiconductor package 100 may include other features not shown in FIG. 1 for the purpose of brevity of discussion.

When current flows through signal paths of a semiconductor die, typically interconnect metal in various metal layers, electromagnetic fields and noise are generated. In semiconductor package 100, interconnects 114 and 134 are examples of signal paths for top active die 110 and bottom active die 130, respectively. During normal operation, transient currents running through interconnects 134 generate electromagnetic field 102. In FIG. 1, an electric field portion of electromagnetic field 102 is depicted as dashed arrows, and a magnetic field portion of electromagnetic field 102 is depicted as dotted ellipses. As seen in FIG. 1, electromagnetic field 102 causes electromagnetic coupling between interconnects 114 and 134, thus creating electromagnetic noise. Electromagnetic noise due to electromagnetic field 102 undesirably generates crosstalk noise in signals transmitted by interconnects 114 and 134.

More specifically, electromagnetic field 102 induces a current in interconnects 114 due to a magnetic field generated by a current in interconnects 134. Electromagnetic field 102 may also cause capacitive coupling between interconnects 114 and 134 due to an electric field generated by interconnects 134. In addition, the crosstalk noise may not be limited to top active die 110 and bottom active die 130, as electromagnetic coupling may occur between additional or non-adjacent dies in the stack (not shown in FIG. 1). Even if the crosstalk noise is of little amplitude, crosstalk noise on the signal could impair functionality of the active dies.

Figure 2:
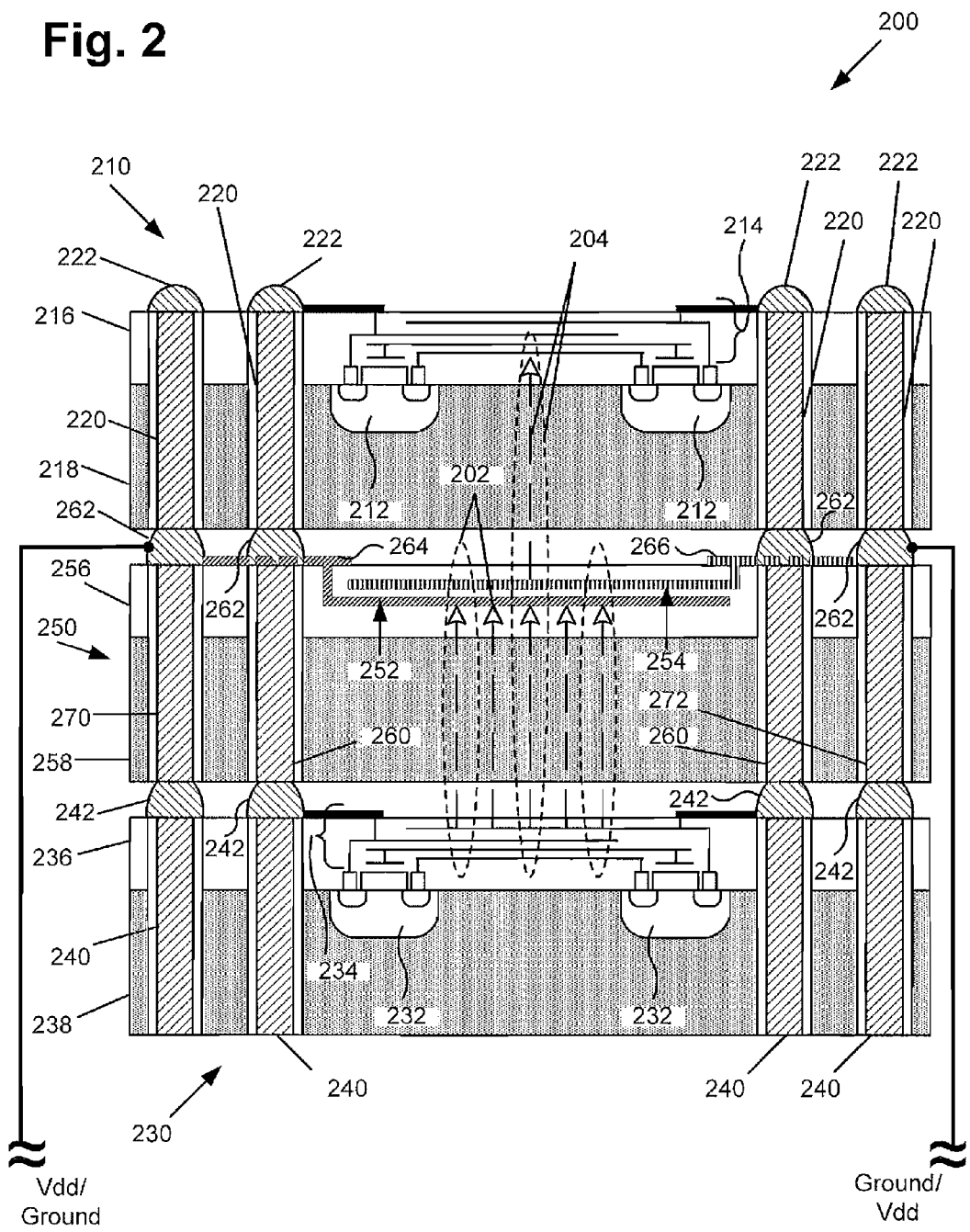
FIG. 2 shows a cross-sectional view of one implementation of a semiconductor package having a top active die stacked on a shield interposer, further stacked on a bottom active die.

Turning to FIG. 2, FIG. 2 presents a cross-sectional view of a semiconductor package including one implementation of a shield interposer. As depicted in FIG. 2, semiconductor package 200 includes bottom active die 230, shield interposer 250, and top active die 210. Top active die 210 may correspond to top active die 110 in FIG. 1. Bottom active die 230 may correspond to bottom active die 130 in FIG. 1.

Top active die 210 includes dielectric layer 216 situated on substrate 218. Top active die 210 also includes transistors 212, which are interconnected through interconnects 214. As seen in FIG. 2, interconnects 214 may be partially disposed within dielectric layer 216. Interconnects 214 may further couple transistors 212 to TSVs 220. TSVs 220 may extend completely through dielectric layer 216 and substrate 218, as shown in FIG. 2. Although FIG. 2 depicts top active die 210 having four TSVs 220, in other implementations, top active die 210 may include a different number of TSVs 220. In addition, top active die 210 also includes microbumps 222, which may be connected to TSVs 220.

Further, transistors 212, interconnects 214, dielectric layer 216, substrate 218, TSVs 220, and microbumps 222 may correspond, respectively, to transistors 112, interconnects 114, dielectric layer 116, substrate 118, TSVs 120, and microbumps 122 in FIG. 1.

Bottom active die 230 includes dielectric layer 236 situated on substrate 238. Bottom active die 230 also includes transistors 232, which are interconnected through interconnects 234. As seen in FIG. 2, interconnects 234 may be partially disposed within dielectric layer 236. Interconnects 234 may further couple transistors 232 to TSVs 240. TSVs 240 may extend completely through dielectric layer 236 and substrate 238, as shown in FIG. 2. Although FIG. 2 depicts bottom active die 230 having four TSVs 240, in other implementations, bottom active die 230 may include a different number of TSVs 240. In addition, bottom active die 230 also includes microbumps 242, which may be connected to TSVs 240. Further, microbumps 242 attach shield interposer 250 to bottom active die 230. Microbumps 242 electrically and mechanically connect TSVs 240 to TSVs 260, 270, and 272.

Although in FIG. 2 top active die 210 and bottom active die 230 are similar in size and complexity, in other implementations, top active die 210 and bottom active die 230 may not be similar. Further, transistors 232, interconnects 234, dielectric layer 236, substrate 238, TSVs 240, and microbumps 242 may correspond, respectively, to transistors 132, interconnects 134, dielectric layer 136, substrate 138, TSVs 140, and microbumps 142 in FIG. 1.

Shield interposer 250 includes dielectric layer 256 situated on substrate 258. Shield interposer 250 further includes electromagnetic shield 252 and electromagnetic shield 254. In the implementation shown in FIG. 2, electromagnetic shield 252 is coupled to an outermost TSV near electromagnetic shield 252, i.e. TSV 270. Similarly, electromagnetic shield 254 is coupled to an outermost TSV near electromagnetic shield 254, i.e. TSV 272 in FIG. 2. Electromagnetic shields 252 and 254 may be disposed entirely within dielectric layer 256. As depicted in FIG. 2, electromagnetic shield 254 overlaps electromagnetic shield 252 within dielectric layer 256. In the present example, electromagnetic shields 252 and 254 overlap without contacting each other. As such, electromagnetic shields 252 and 254 may be coupled to respective fixed potentials. Electromagnetic shield 252 may be coupled to a Vdd (or a ground) potential whereas electromagnetic shield 254 may be coupled to a ground (or Vdd) potential.

FIG. 2 presents an exemplary implementation of electromagnetic shields 252 and 254. However, in other implementations, electromagnetic shields 252 and 254 may not, for example, overlap. For instance, electromagnetic shields 252 and 253 may have smaller dimensions than depicted in FIG. 2 so that they do not overlap within dielectric layer 256. In other implementations, electromagnetic shields 252 and 254 may be coupled to each other, or otherwise coupled to the same fixed potential. Alternatively, electromagnetic shields 252 and 254 may be coupled to any other fixed potentials. Moreover, in other implementations, electromagnetic shields 252 and 254 may be coupled to other TSVs 260, 270, and 272. However, electromagnetic shields 252 and 254 may be directly connected to respective fixed potentials, or may be connected through any other means, such as through interconnects 264 and 266 and microbumps 262.

TSVs 260, 270, and 272 may extend completely through dielectric layer 256 and substrate 258, as shown in FIG. 2. Although FIG. 2 depicts shield interposer 250 including four TSVs, in other implementations, shield interposer 250 may include a different number of TSVs. Shield interposer 250 also includes microbumps 262, which may connect TSVs 260, 270, and 272 respectively to TSVs 220, as seen in FIG. 2. Microbumps 262 further attaches top active die 210 to shield interposer 250. Also shown in FIG. 2, top active die 210, shield interposer 250, and bottom active die 230 may be electrically connected through at least TSVs 220, 260, 270, 272, and 240, and microbumps 262 and 242.

During normal operation, transient currents running through interconnects 234 of bottom active die 230 generate electromagnetic field 202. In FIG. 2, an electric field portion of electromagnetic field 202 is depicted as dashed arrows, and a magnetic field portion of electromagnetic field 202 is depicted as dotted ellipses. In contrast to FIG. 1, however, shield interposer 250 shields interconnects 214 of top active die 210 from being electromagnetically coupled to interconnects 234 of bottom active die 230. In particular, electromagnetic field 202 causes interconnects 234 to be electromagnetically coupled to electromagnetic shields 252 and 254 rather than interconnects 214. In effect, shield interposer 250 substantially terminates electromagnetic field 202. For example, electromagnetic field 202 induces a current in electromagnetic shields 252 and 254 rather than interconnects 214. Electromagnetic field 202 may also cause capacitive coupling between interconnects 234 and electromagnetic shields 252 and 254 rather than interconnects 214.

However, residual electromagnetic field 204 may still electromagnetically couple interconnect 214 of top active die 210 with interconnect 234 of bottom active die 230, as seen in FIG. 2. Compared to electromagnetic field 102 in FIG. 1, electromagnetic noise due to electromagnetic field 202 is significantly reduced. As such, semiconductor package 200, having shield interposer 250, may advantageously have reduced electromagnetic noise relative to semiconductor package 100, having no shield interposer.

As further seen in FIG. 2, electromagnetic shields 252 and 254 are connected to fixed potentials. By connecting electromagnetic shields 252 and 254 to potentials, shield interposer 250 provides an additional advantage of decoupling capacitance, which may provide further benefits to power integrity. For example, in FIG. 2, electromagnetic shield 252 is connected to Vdd, and electromagnetic shield 254 is connected to ground. As such, electromagnetic shields 252 and 254 can provide decoupling capacitance between Vdd and ground.

Figure 3A:
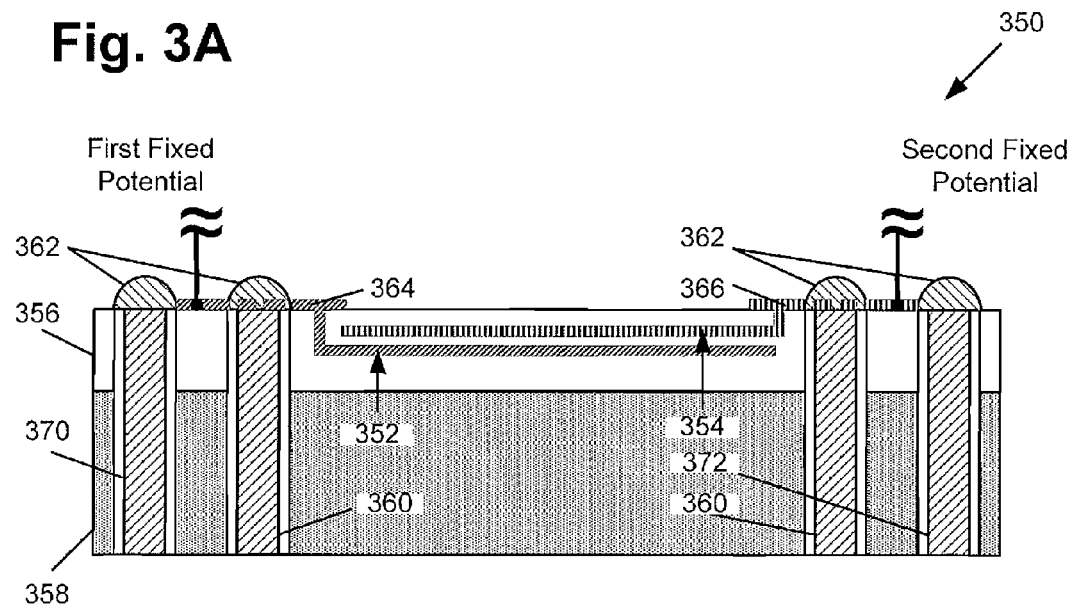
FIG. 3A shows a cross-sectional view of one implementation of a shield interposer.
Figure 3B:
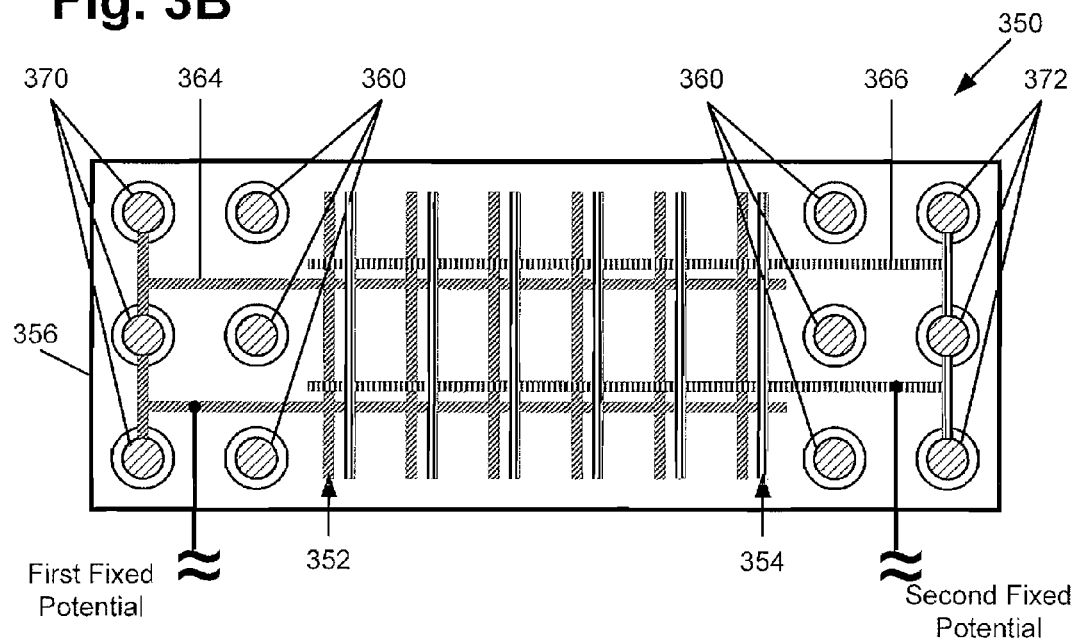
FIG. 3B shows a top-down view of the shield interposer shown in FIG. 3A.

Turning to FIGS. 3A and 3B, FIGS. 3A and 313 present one implementation of a shield interposer. FIG. 3A presents a cross-sectional view of shield interposer 350, and FIG. 3B presents a top-down view of shield interposer 350. Shield interposer 350 may correspond to shield interposer 250 in FIG. 2. Specifically, dielectric layer 356, substrate 358, TSVs 360, microbumps 362, interconnects 364, interconnects 366, TSV 370, TSV 372, electromagnetic shield 352, and electromagnetic shield 354 may correspond, respectively, to dielectric layer 256, substrate 258, TSVs 260, microbumps 262, interconnects 264, interconnects 266, TSV 270, TSV 272, electromagnetic shield 252, and electromagnetic shield 254 in FIG. 2. For the sake of brevity, similarities between shield interposer 350 and shield interposer 250 will not be discussed.

In FIG. 3B, substrate 358 is obscured by dielectric layer 356, and microbumps 362 are not shown. In addition, parts of dielectric layer 356 are not shown in order to depict interconnects 364 and 366, which are disposed on a top surface of dielectric layer 356, as well as electromagnetic shields 252 and 254, which are disposed within dielectric layer 356.

Electromagnetic shields 352 and 354 are made of a conductive material, such as metal, arranged in grids. For instance, as seen in FIG. 3B, electromagnetic shield 352 includes a grid of conductive layers. Electromagnetic shield 354 similarly includes a grid of conductive layers. As further seen in FIG. 3A, electromagnetic shield 354 is disposed within dielectric layer 356, although above electromagnetic shield 352, which is also disposed within dielectric layer 356. This arrangement results in electromagnetic shield 354 at least partially overlapping electromagnetic shield 352, as depicted in FIGS. 3A and 3B. However, in other implementations, electromagnetic shields 352 and 354 may take on other shapes, such as a plate, and may also be configured to not overlap.

FIG. 3B further shows one implementation of TSVs 360, 370, and 372. In FIG. 3B, shield interposer 350 includes TSVs arranged in rows along outer edges of shield interposer 350, such as TSVs 370, and TSVs 372. Shield interposer 350 further includes inner rows of TSVs away from the outer edges, such as TSVs 360. This TSV arrangement may mirror TSV arrangements of active dies, such as top active die 210 and bottom active die 230 in FIG. 2.

In the implementation depicted in FIG. 3B, interconnects 364 connects electromagnetic shield 352 only to the TSVs along the outer edge, i.e. TSVs 370. Similarly, interconnects 366 connects electromagnetic shield 354 only to the TSVs along the outer edge, i.e. TSVs 372. In other implementations, electromagnetic shields 352 and 354 may be connected to other TSVs 360.

Figure 5:
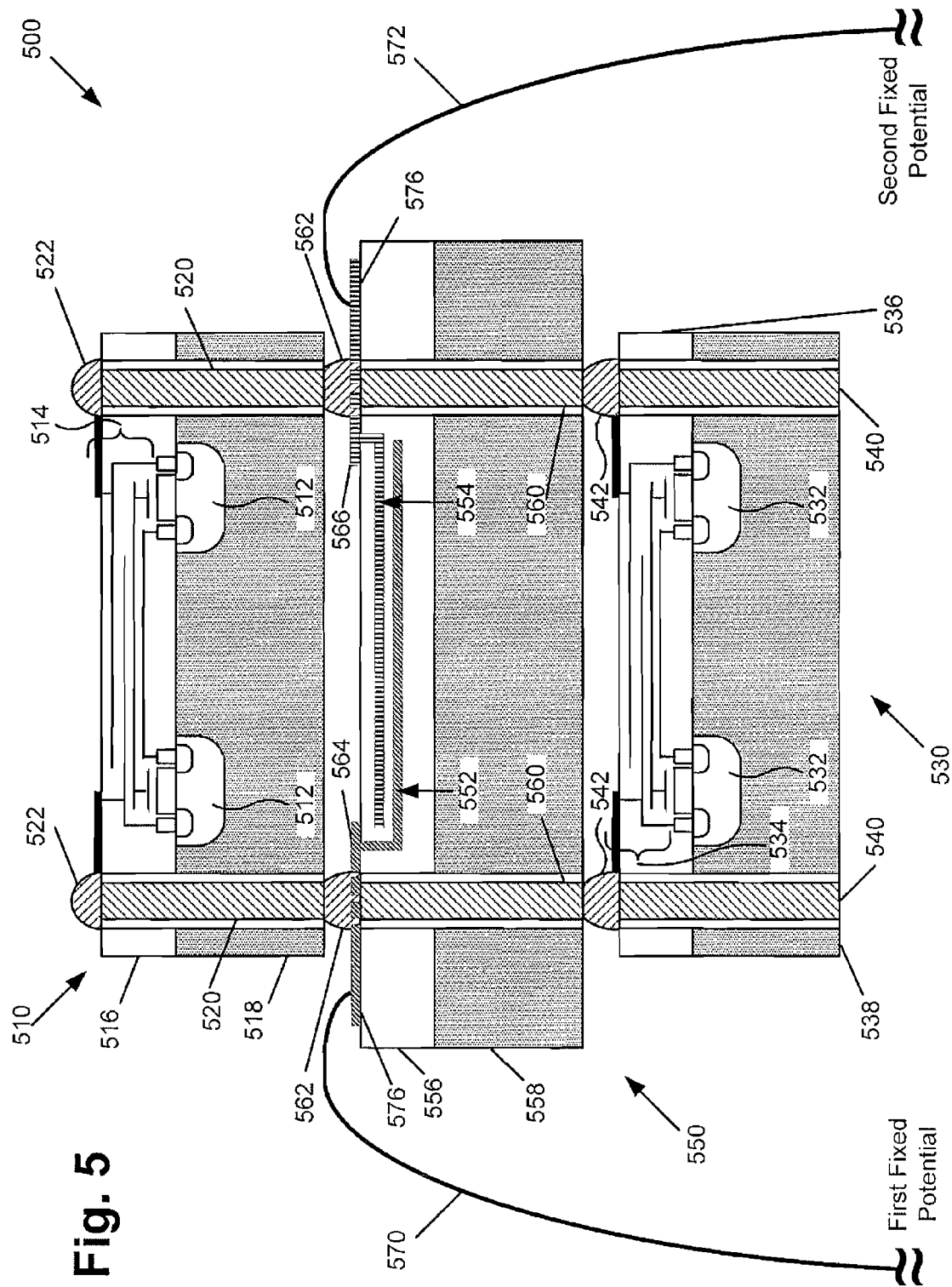
FIG. 5 shows a cross-sectional view of one implementation of a semiconductor package including a shield interposer having wirebonds.

In FIGS. 3A and 3B, electromagnetic shields 352 and 354 are directly connected to the first and second fixed potentials, respectively. However, FIGS. 4 and 5 present alternative implementations for electrically connecting the electromagnetic shields.

Turning now to FIG. 4, FIG. 4 presents a cross-sectional view of a semiconductor package according to one implementation of a shield interposer. FIG. 4 depicts semiconductor package 400, which includes bottom active die 430, shield interposer 450 situated on bottom active die 430, and top active die 410 situated on shield interposer 450. Bottom active die 430, which includes transistors 432, interconnects 434, dielectric layer 436, substrate 438, TSVs 440, and microbumps 442, may correspond, respectively, to bottom active die 230, transistors 232, interconnects 234, dielectric layer 236, substrate 238, TSVs 240, and microbumps 242 in FIG. 2. Likewise, top active die 410, which includes transistors 412, interconnects 414, dielectric layer 416, substrate 418, TSVs 420, and microbumps 422, may correspond, respectively, to top active die 210, transistors 212, interconnects 214, dielectric layer 216, substrate 218, TSVs 220, and microbumps 222 in FIG. 2. For the sake of brevity, top active die 410 and bottom active die 430 will not be discussed.

Shield interposer 450 may correspond to shield interposer 250 in FIG. 2. In addition, electromagnetic shields 452 and 454, dielectric layer 456, substrate 458, TSVs 460, microbumps 462, interconnects 464 and 466, and TSV 470 and TSV 472 may correspond, respectively, to electromagnetic shields 252 and 254, dielectric layer 256, substrate 258, TSVs 260, microbumps 262, interconnects 264 and 266, and TSV 270 and TSV 272 in FIG. 2. For the sake of brevity, similarities between shield interposer 450 and shield interposers 250 and 350 will not be discussed.

In the implementation depicted in FIG. 4, shield interposer 450 differs from shield interposers 350 and 250 in its dimensions with respect to top active die 410 and bottom active die 430. As shown in FIG. 4, shield interposer 450 laterally extends beyond top active die 410 and bottom active die 430. Specifically in FIG. 4, shield interposer 450 laterally extends beyond top active die 410 and bottom active die 430 on two sides, which is not a limiting feature.

TSVs 470 and 472 are disposed within portions of shield interposer 450 that laterally extend beyond top active die 410 and bottom active die 430. TSVs 470 and 472 are connected to electromagnetic shields 452 and 454 through interconnects 464 and 466, respectively. TSVs 470 and 472 are not connected to TSVs 440 of bottom active die 430 or TSVs 420 of top active die 410. Rather, TSVs 470 and 472 are connected to solder bumps 474. As seen in FIG. 4, solder bumps 474 are disposed on a bottom surface of the portions of shield interposer 450 that laterally extend beyond top active die 410 and bottom active die 430. Solder bumps 474 may be connected to first and second fixed potentials, such as Vdd or ground. In FIG. 4, solder bumps 474 are conventional solder bumps, such as C4 bumps, which allows for easier connections external to semiconductor package 400.

Solder bumps 474 are advantageously disposed outside the active die boundary. Solder bumps 474 may provide connection to the packaging substrate (not shown in FIG. 4) on which semiconductor package 400 may be attached. Solder bumps 474 further allows for electromagnetic shields 452 and 454 to be electrically connected to potentials not available through TSVs of the active dies. For instance, in FIG. 4, TSVs 420, 460, and 440 along one side of semiconductor package 400 may be connected to a first potential, and TSVs 420, 460, and 440 along the other side may be connected to a second potential. However, TSVs 470 and 472 are electrically isolated from TSVs 420, 460, and 440. Therefore, TSVs 470 and 472 may connect electromagnetic shields 452 and 454 to third and fourth potentials, respectively, through solder bumps 474.

Referring to FIG. 5, FIG. 5 presents a cross-sectional view of another implementation of a shield interposer. Semiconductor package 500 includes bottom active die 530, shield interposer 550 situated on bottom active die 530, and top active die 510 situated on shield interposer 550. Bottom active die 530, which includes transistors 532, interconnects 534, dielectric layer 536, substrate 538, TSVs 540, and microbumps 542, may correspond, respectively, to bottom active die 230, transistors 232, interconnects 234, dielectric layer 236, substrate 238, TSVs 240, and microbumps 242 in FIG. 2. Likewise, top active die 510, which includes transistors 512, interconnects 514, dielectric layer 516, substrate 518, TSVs 520, and microbumps 522, may correspond, respectively, to top active die 210, transistors 212, interconnects 214, dielectric layer 216, substrate 218, TSVs 220, and microbumps 222 in FIG. 2. For the sake of brevity, top active die 510 and bottom active die 530 will not be discussed.

Shield interposer 550 may correspond to shield interposer 250 in FIG. 2. In addition, electromagnetic shields 552 and 554, dielectric layer 556, substrate 558, TSVs 560, microbumps 562, and interconnects 564 and 566 may correspond, respectively, to electromagnetic shields 252 and 254, dielectric layer 256, substrate 258, TSVs 260, microbumps 262, and interconnects 264 and 266 in FIG. 2. For the sake of brevity, similarities between shield interposer 450 and shield interposers 250 and 350 will not be discussed.

Similar to shield interposer 450 in FIG. 4, shield interposer 550 laterally extends beyond top active die 510 and bottom active die 530 on two sides, although the number of sides is not limiting. In addition, similar to electromagnetic shields 452 and 454, electromagnetic shield 552 and 554 may be electrically connected to potentials not available through any TSVs of the active dies. Unlike shield interposer 450, electromagnetic shields 552 and 554 are connected to the first and second fixed potentials through wirebonds 570 and 572. As seen in FIG. 5, wirebonds 570 and 572 may be connected externally to semiconductor package 500. For example, wirebonds 570 and 572 may be connected to potentials on the packaging substrate (not shown in FIG. 5), which semiconductor package 500 is attached to. Further, wirebonds 570 and 572 are connected to electromagnetic shields 552 and 554, respectively, through peripheral pads 576. Wirebonds 570 and 572 and peripheral pads 576 are disposed outside the active die boundary, as depicted in FIG. 5.

Peripheral pads 576 are situated on a top surface of dielectric layer 556 of shield interposer 550. Specifically, peripheral pads 576 are disposed over portions of shield interposer 550 that laterally extend beyond top active die 510 and bottom active die 530, as shown in FIG. 5. Wirebonds 570 and 572 may be connected to Vdd and/or ground, or other fixed potentials. Wirebonds 570 and 572 allow for simpler external connections, and for further design flexibility.

Wirebonds 570 and 572 provide the added benefit of additional electromagnetic shielding beyond the shielding provided by electromagnetic shields 552 and 554. As seen in FIG. 5, electromagnetic shields 552 and 554 are generally restricted to the size of top active die 510 and bottom active die 530. Because wirebonds 570 and 572 are connected to the same fixed potentials as electromagnetic shields 552 and 554, respectively, wirebonds 570 and 572 provide similar electromagnetic shielding. Wirebonds 570 and 572 extend beyond electromagnetic shields 552 and 554, and therefore may provide electromagnetic shielding along their respective sides of semiconductor package 500.

Thus, by situating electromagnetic shields between active regions of stacked active dies, various implementations of the concepts disclosed herein advantageously shield the active dies from electromagnetic noise. In addition, the disclosed implementations advantageously enable production of interposers having electromagnetic shields. The described implementations disclose a shield interposer situated between a top active die and a bottom active die, and has an interposer dielectric layer, TSVs passing through the interposer dielectric layer, and an electromagnetic shield connected to a fixed potential through the TSVs. As a result, the present concepts advantageously enable electromagnetic shielding between active dies stacked on each other.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A shield interposer situated between a top active die and a bottom active die for shielding said top active die and said bottom active die from electromagnetic noise, said shield interposer comprising:
    a substrate;
    an interposer dielectric layer situated on said substrate;
    a through-silicon via (TSV) within said interposer dielectric layer;
    an electromagnetic shield connected to a fixed potential through said TSV.

2. The shield interposer of claim 1, wherein said electromagnetic shield comprises a grid of conductive layers.

3. The shield interposer of claim 1, wherein said electromagnetic shield is disposed entirely within said interposer dielectric layer.

4. The shield interposer of claim 1, wherein said electromagnetic shield is partially disposed within said interposer dielectric layer.

5. The shield interposer of claim 1, wherein said fixed potential is a ground potential.

6. The shield interposer of claim 1, wherein said fixed potential is a Vdd potential.

7. The shield interposer of claim 1, further comprising another electromagnetic shield connected to another fixed potential.

8. The shield interposer of claim 7, wherein said another electromagnetic shield at least partially overlaps said electromagnetic shield.

9. The shield interposer of claim 7, wherein said fixed potential is a Vdd potential, and said another fixed potential is a ground potential.

10. A semiconductor package comprising:
    a bottom active die;
    a shield interposer situated over said bottom active die;
    a top active die situated over said shield interposer for shielding said top active die and said bottom active die from electromagnetic noise;
    said shield interposer having a substrate, an interposer dielectric layer situated on said substrate, a through-silicon via (TSV) within said interposer dielectric layer, and an electromagnetic shield connected to a fixed potential through said TSV.

11. The semiconductor package of claim 10, wherein said shield interposer laterally extends beyond said bottom active die and said top active die.

12. The semiconductor package of claim 10, wherein a portion of said shield interposer laterally extends beyond said bottom active die and said top active die, said TSV situated within said portion of said shield interposer;
    said shield interposer further comprising a solder hump situated on a bottom surface of said portion of said shield interposer, said solder bump connected to said TSV.

13. The semiconductor package of claim 10, wherein said electromagnetic shield comprises a grid of conductive layers.

14. The semiconductor package of claim 10, wherein said electromagnetic shield is disposed entirely within said interposer dielectric layer.

15. The semiconductor package of claim 10, wherein said fixed potential is a ground potential or a Vdd potential.

16. A semiconductor package comprising:
a bottom active die;
a shield interposer situated over said bottom active die, said shield interposer including a substrate and an interposer dielectric layer situated on said substrate;
a top active die situated over said shield interposer for shielding said top active die and said bottom active die from electromagnetic noise;
said shield interposer having an electromagnetic shield connected to a fixed potential through a wirebond.

17. The semiconductor package of claim 16, wherein a portion of said shield interposer laterally extends beyond said bottom active die and said top active die;
said shield interposer further comprising a peripheral pad situated on a top surface of said portion of said shield interposer, said peripheral pad connected to said electromagnetic shield, and said wirebond connected to said peripheral pad.

18. The semiconductor package of claim 16, wherein said electromagnetic shield comprises a grid of conductive layers.

19. The semiconductor package of claim 16, wherein said electromagnetic shield is disposed entirely within said interposer dielectric layer.

20. The semiconductor package of claim 16, wherein said fixed potential is a ground potential or a Vdd potential.

\* \* \* \* \*